US007226524B2

(12) United States Patent
Kasai et al.

(10) Patent No.: US 7,226,524 B2
(45) Date of Patent: Jun. 5, 2007

(54) PLASMA PROCESSING APPARATUS

(75) Inventors: Shigeru Kasai, Nirasaki-shi (JP);
Nobuhiko Yamamoto, Amagasaki-shi (JP); Hikaru Adachi, Amagasaki-shi (JP); Yuki Osada, Nirasaki-shi (JP)

(73) Assignee: Tokyo Electron Limited, Tokyo (JP)

( * ) Notice: Subject to any disclaimer, the term of this patent is extended or adjusted under 35 U.S.C. 154(b) by 15 days.

(21) Appl. No.: 10/498,672

(22) PCT Filed: Nov. 25, 2002

(86) PCT No.: PCT/JP02/12279

§ 371 (c)(1),
(2), (4) Date: Jun. 14, 2004

(87) PCT Pub. No.: WO03/052807

PCT Pub. Date: Jun. 26, 2003

(65) Prior Publication Data

US 2005/0034815 A1    Feb. 17, 2005

(30) Foreign Application Priority Data

Dec. 14, 2001  (JP)  .............................. 2001-381539

(51) Int. Cl.
*C23C 16/00*   (2006.01)
*H01L 21/306*  (2006.01)
*C23F 1/00*    (2006.01)

(52) U.S. Cl. .......................... 156/345.36; 156/345.41; 156/345.42; 156/345.46; 156/345.49; 118/723 MW

(58) Field of Classification Search ....... 118/723 MW; 156/345.36, 345.41
See application file for complete search history.

(56) References Cited

U.S. PATENT DOCUMENTS 5,654,679 A * 8/1997 Mavretic et al. ........... 333/17.3
6,127,908 A * 10/2000 Bozler et al. ............... 333/246
6,225,756 B1 * 5/2001 Gitsevich .................... 315/248
6,311,638 B1 * 11/2001 Ishii et al. ............ 118/723 MW
6,528,752 B1 * 3/2003 Ishii et al. ............. 219/121.43
6,579,426 B1 * 6/2003 van Gogh et al. ...... 204/192.25

(Continued)

FOREIGN PATENT DOCUMENTS

EP         478 283         4/1992

(Continued)

*Primary Examiner*—Parviz Hassanzadeh
*Assistant Examiner*—Rakesh Dhingra
(74) *Attorney, Agent, or Firm*—Oblon, Spivak, McClelland, Maier & Neustadt, P.C.

(57) ABSTRACT

A plasma processing apparatus includes an evacuatable processing vessel; a workpiece mount base for mounting thereon an object to be processed; a microwave transmitting plate provided in an opening of a ceiling of the processing vessel; a planar antenna member for supplying a microwave into the processing vessel via the microwave transmitting plate; a shield lid grounded to cover a top of the planar antenna member; a waveguide for guiding the microwave to the planar antenna member; a member elevating mechanism for relatively varying a vertical distance between the planar antenna member and the shield lid; a tuning rod insertable into the waveguide; a tuning rod driving mechanism for moving the tuning rod to adjust an insert amount thereof; and a matching control section for controlling an elevation amount of the planar antenna member and the insert amount of the tuning rod to obtain a matching adjustment.

12 Claims, 8 Drawing Sheets

U.S. PATENT DOCUMENTS 6,646,224 B2 * 11/2003 Goto et al. ............ 219/121.43
2002/0011310 A1 * 1/2002 Kamarehi et al. .......... 156/345

FOREIGN PATENT DOCUMENTS

| | | |
|---|---|---|
| JP | 64-014921 | 1/1989 |
| JP | 64-042130 | 2/1989 |
| JP | 106824/1990 | 8/1990 |
| JP | 6-61153 | 3/1994 |
| JP | 6-231711 | 8/1994 |
| JP | 06231711 A * | 8/1994 |
| JP | 10-12594 | 1/1998 |
| JP | 200160557 A * | 3/2001 |
| JP | 2001-326216 | 11/2001 |

* cited by examiner

PLASMA PROCESSING APPARATUS

FIELD OF THE INVENTION

The present invention relates to a plasma processing apparatus for processing a semiconductor wafer and the like by applying thereon a plasma generated by a microwave.

BACKGROUND OF THE INVENTION

Along with a recent trend of a high density and a high miniaturization of semiconductor devices, a plasma processing apparatus is used for performing a film forming process, an etching process, an ashing process and the like in a manufacturing process of the semiconductor devices. Especially, since a plasma can be stably generated in an environment at a high vacuum level in which a pressure is comparatively low, e.g., ranging from 0.1 to several tens mTorr, a plasma processing apparatus for processing a wafer by using a high-density plasma generated by a microwave tends to be used.

Such plasma processing apparatus is disclosed in Japanese Patent Laid-Open Publication Nos. 3-191073 and 5-343334 or Japanese Patent Laid-Open Publication No. 9-181052 filed by the applicant of the present invention. Herein, a conventional plasma processing apparatus using a microwave will be schematically described with reference to FIG. 9. FIG. 9 shows a view illustrating a conventional typical plasma processing apparatus.

Referring to FIG. 9, there is illustrated a plasma processing apparatus 2 having a workpiece mount base 6 for mounting thereon a semiconductor wafer W in an evacuatable processing vessel 4. Further, hermetically provided on a ceiling portion facing the workpiece mount base 6 is a microwave transmitting window 8, made of, e.g., disc-shaped aluminum nitride and the like, for transmitting a microwave. Specifically, the microwave transmitting window 8 is hermetically installed via a sealing member 14 such as an O-ring and the like on a supporting bracket 12 protruded inwardly along a radial direction of a ring-shaped supporting frame member 10, wherein the supporting frame member 10 made of, e.g., aluminum, is installed at an upper portion of the processing vessel 4.

Further, provided on a top surface of the microwave transmitting window 8 are a disc-shaped planar antenna member 16 having a thickness of several mm and a wave-delay member 18, if necessary, made of, e.g., a dielectric material, for shortening a wavelength of the microwave along a radial direction of the planar antenna member 16. A shield lid 19 made of a conductor is used for covering top portions of the planar antenna member 16 and the wave-delay member 18 and blocking a top portion of the processing vessel 4. Moreover, installed above the wave-delay member 18 is a ceiling cooling jacket 22 having therein a cooling water path 20 for allowing cooling water to flow therethrough to cool the shield lid 19 and the like. Besides, formed through the antenna member 16 are microwave radiation holes 24 including a plurality of approximately circular or slit-shaped through-holes. Additionally, an internal conductor 28 of a coaxial waveguide 26 is connected to a central portion of the planar antenna member 16. The coaxial waveguide 26 is connected to a rectangular waveguide 32 via a mode converter 30, and the rectangular waveguide 32 is sequentially connected to a matching circuit 34 and a microwave generating source 36. Accordingly, a microwave of, e.g., 2.45 GHz, generated from the microwave generating source 36 can be guided to the antenna member 16. The microwave which propagates along a radial direction of the antenna member 16 is emitted through the microwave radiation holes 24 provided in the antenna member 16 toward the microwave transmitting window 8. Then, the microwave transmitted through the microwave transmitting window 8 is introduced into the processing vessel 4, thereby generating a plasma in the processing vessel 4 to perform a plasma processing such as an etching, a film formation and the like on a semiconductor wafer W.

The microwave generating source 36 described above typically generates a high power of about 5 KW and, therefore, the matching circuit 34 for restricting a reflection wave to be generated becomes large. Accordingly, the matching circuit 34 is provided on a floor portion which is located at an outside of a frame of the plasma processing apparatus 2 so that a relatively long rectangular waveguide 32 must be used to connect the matching circuit 34 to the mode converter 30.

Maintenance and repairing works of such plasma processing apparatus 2 are regularly or irregularly carried out. At this time, the shield lid 19 or the microwave transmitting window 8 is separated to examine the antenna member 16, the wave-delay member 18, a structure in the processing vessel 4 and the like.

However, in order to separate the shield lid 19 covering the top portion of the processing vessel 4, the long and large rectangular waveguide 32 connected to the shield lid 19 as one body should be separated by loosening screws and the like (not shown) of a flange portion 32A. Thus, the maintenance and the repairing works of the plasma processing apparatus 2 become quite complex.

Further, as described above, since a length of the rectangular waveguide 32 is relatively long, a multiple reflection of the microwave can easily occur therein and further, a load will be increased accordingly to thereby cause a power loss, resulting in deterioration of a power efficiency.

Since, moreover, a distance between the matching circuit 34 and a plasma becomes as large as several wavelengths, an impedance therebetween becomes overwhelmingly greater in comparison with a plasma impedance of the plasma. Consequently, the plasma impedance is not properly reflected in the matching circuit 34, so that it is difficult to appropriately control an ignition of the plasma and a stabilization of the plasma by using the matching circuit 34.

SUMMARY OF THE INVENTION

The present invention has been developed in order to effectively solve the aforementioned drawbacks. Therefore, an object of the present invention is to provide a plasma processing apparatus in which a matching circuit is scaled down such that a microwave generating source and the like can be mounted on a shield lid as one body.

In accordance with a preferred embodiment of the present invention, there is provided a plasma processing apparatus comprising: an evacuatable processing vessel; a workpiece mount base, installed in the processing vessel, for mounting thereon an object to be processed; a microwave transmitting plate provided in an opening of a ceiling of the processing vessel; a planar antenna member for supplying a microwave into the processing vessel via the microwave transmitting plate; a shield lid grounded to cover a top of the planar antenna member; a waveguide for guiding the microwave from a microwave generating source to the planar antenna member; a member elevating mechanism for relatively varying a vertical distance between the planar antenna member and the shield lid; a tuning rod insertable into the waveguide; a tuning rod driving mechanism for moving the tuning rod to adjust an insert amount thereof; and a matching control section for controlling an elevation amount of the planar antenna member and the insert amount of the tuning rod to obtain a matching adjustment.

Accordingly, since both the planar antenna member which is moved relatively up and down and the tuning rod whose amount of insertion into the waveguide may be controllable are used to perform a matching function for preventing the reflection wave of the microwave from being generated, the structure of the propagation system of the microwave can be greatly reduced and, accordingly, the propagation system of the microwave, which includes the microwave generating source, can be mounted on the shield lid as a unit.

As a result, maintenance and repairing works of the plasma processing apparatus can be carried out simply by separating the shield lid from the processing vessel without separating the waveguide and the like. Thus, the maintenance and repairing works thereof can be performed quickly and easily.

Further, since the length of the waveguide in which the microwave propagates can be shortened, it is possible to suppress the generation of the reflection wave or the power loss, improving a controllability on the plasma by the matching circuit.

In this case, a reflection wave detecting section for detecting a state of a reflection wave of the microwave is installed in the waveguide at an upstream of the tuning rod.

The detected state of the detected reflection wave, for example, is represented in terms of a power and a phase.

The waveguide has, for example, at a middle portion thereof a mode converter for converting a vibration mode of the microwave.

The waveguide has therein a driving shaft for elevating, for example, the antenna member.

Further, a plasma processing apparatus in accordance with the present invention includes: an evacuatable processing vessel; a workpiece mount base, installed in the processing vessel, for mounting thereon an object to be processed; a microwave transmitting plate provided in an opening of a ceiling of the processing vessel; a planar antenna member installed above the microwave transmitting plate; a shield lid grounded to cover a top of the planar antenna member; a wave guiding unit for guiding a microwave from a microwave generating source to the planar antenna member; a matching circuit formed by arranging a phase advance element, a phase delay element and a switching device on a printed circuit board between the microwave generating source and the planar antenna member; and a matching control section for switching the switching device to obtain a matching adjustment.

As described above, since the matching circuit is scaled down by using a printed circuit board, it is possible to greatly reduce a size of a structure of the propagation system of the microwave. Therefore, the propagation system of the microwave, which includes the microwave generating source, can be mounted on the shield lid as a unit.

As a result, the maintenance and the repair of the plasma processing apparatus can be carried out simply by separating the shield lid from the processing vessel without separating the waveguide and the like. Thus, the maintenance and repairing works thereof can be carried out quickly and easily.

Further, since the length of the waveguide in which the microwave propagates can be shortened, a generation of the reflection wave of the microwave or a power loss can be avoided.

In this case, the phase advance element and the phase delay element include microstrip lines, for example.

Further, the switching device is a PIN diode, for example.

DETAILED DESCRIPTION OF THE PREFERRED EMBODIMENTS

Hereinafter, a preferred embodiment of a plasma processing apparatus in accordance with the present invention will be described in detail with reference to the accompanying drawings.

Figure 1:
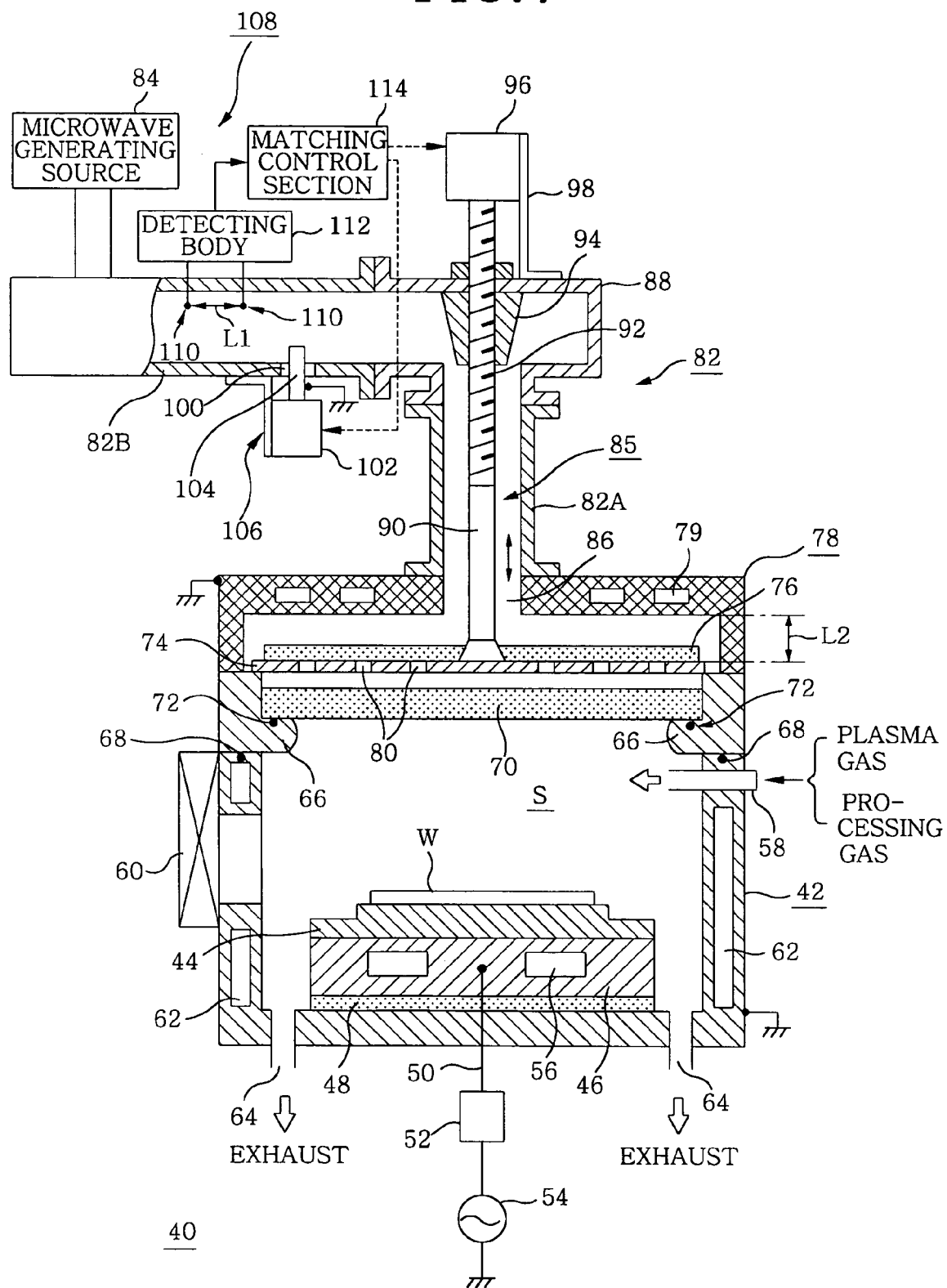
FIG. 1 shows a plasma processing apparatus in accordance with a first preferred embodiment of the present invention.
Figure 2:
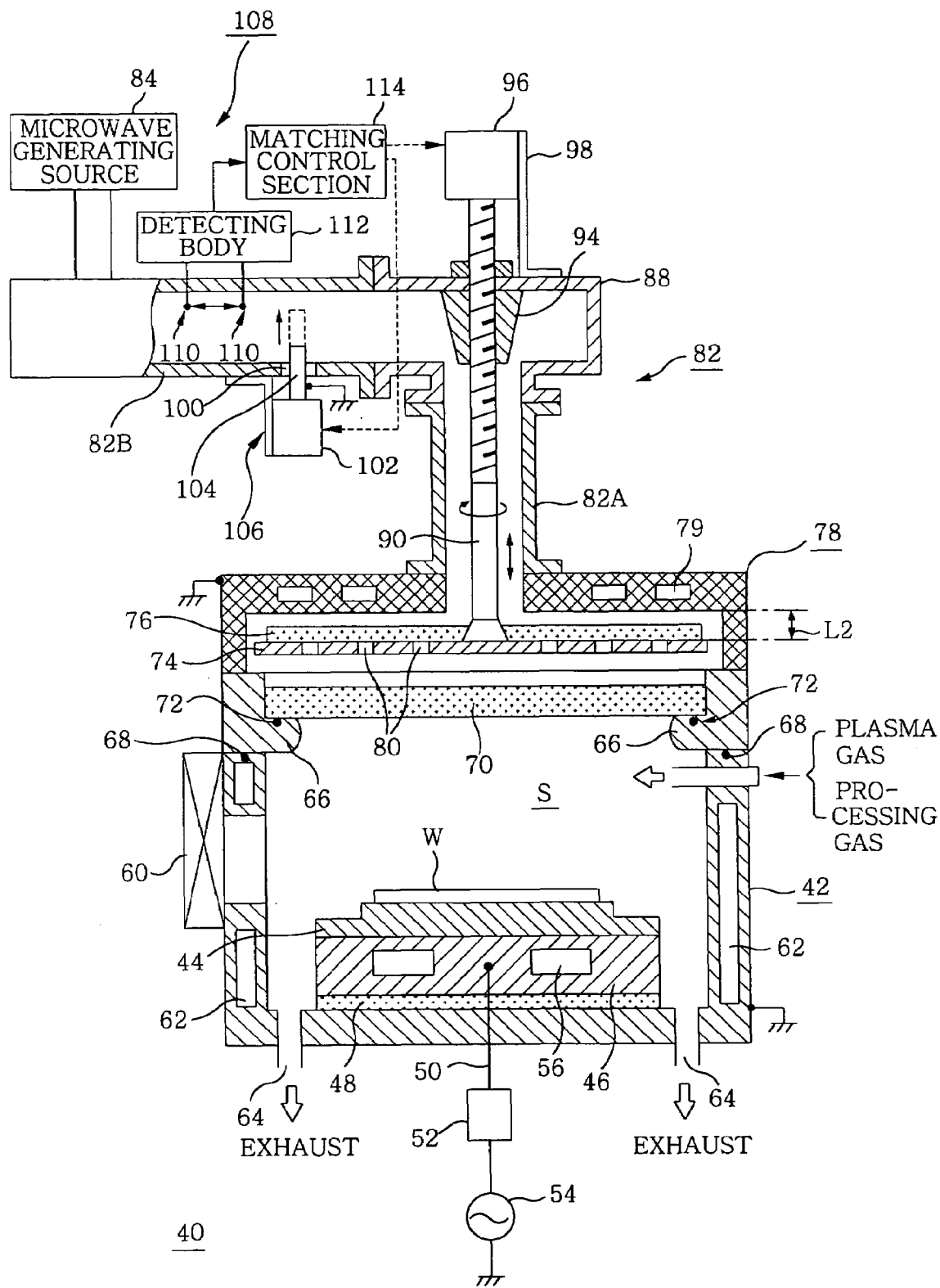
FIG. 2 illustrates a view for explaining an operation of the plasma processing apparatus depicted in FIG. 1.

FIG. 1 shows a configuration view for illustrating a first preferred embodiment of a plasma processing apparatus in accordance with the present invention, and FIG. 2 illustrates a view for explaining an operation of the plasma processing apparatus depicted in FIG. 1.

As illustrated in FIGS. 1 and 2, a plasma processing apparatus 40 has a cylindrical processing vessel 42, wherein the processing vessel 42 has a bottom portion made of a conductor, e.g., aluminum, has a totally cylindrical shape, is grounded, and has therein a sealed processing space S.

The processing vessel 42 has therein a workpiece mount base 44 for mounting thereon, e.g., a semiconductor wafer W, as an object to be processed. The workpiece mount base 44 of an approximately cylindrical shape with a flat top surface is made of alumite-processed aluminum and is protrudently installed. A bottom portion of the workpiece mount base 44 is supported by a cylindrical support 46 made of aluminum and the support 46 is installed at a bottom portion of the processing vessel 42 via an insulating member 48.

Installed on the top surface of the workpiece mount base 44 is an electrostatic chuck or a clamp device (not shown) for holding a wafer on the top surface of the workpiece mount base 44. The workpiece mount base 44 is connected to a high frequency bias power supply 54 of, e.g., 13.56 MHz, by a feeder line 50 via a matching box 52. In some cases, the high frequency bias power supply 54 may not be installed. Even if the high frequency bias power supply 54 is not installed, a bias electrode grounded or electrically floated can be provided, thereby improving an efficiency of a plasma ignition.

Provided in the support 46 for supporting the workpiece mount base 44 is a cooling jacket 56 for letting a cooling water to flow therethrough to cool the wafer during a plasma processing. Further, if necessary, the workpiece mount base 44 may have therein a heater.

Installed on a sidewall of the processing vessel 42 is a gas supply nozzle 58 made of, e.g., a quartz pipe, for introducing a plasma gas, e.g., Ar gas, or a processing gas, e.g., a deposition gas, into the processing vessel 42. Accordingly, the plasma gas and/or the processing gas with a controlled flow rate thereof can be supplied thereinto through the gas supply nozzle 58. The deposition gas serving as the processing gas includes $SiH_4$ gas, $O_2$ gas, $N_2$ gas and the like.

Further, installed on the sidewall of the processing vessel 42 are a gate valve 60 to be opened for loading/unloading the wafer into/from the processing vessel 42 and a cooling jacket 62 for cooling the sidewall of the processing vessel 42. Moreover, a gas exhaust port 64 connected to a vacuum pump (not shown) is provided in a bottom portion of the processing vessel 42, so that an inner space of the processing vessel 42 can be evacuated to a certain pressure level.

In addition, a ceiling portion of the processing vessel 42 is opened to form an opening. A circular ring-shaped supporting frame member 66 is provided along a peripheral portion of the opening via a sealing member 68 such as an O-ring and the like. Hermetically installed on the supporting frame member 66 is a microwave transmitting plate 70 made of a dielectric, e.g., a ceramic material such as AlN and the like with a thickness of about 20 mm, wherein the microwave transmitting plate 70 is transparent to a microwave. Accordingly, the inner space of the processing vessel 42 is kept hermetically sealed.

Further, provided above the microwave transmitting plate 70 is a disc-shaped planar antenna member 74 whose peripheral portion is detachably supported on a top portion of the supporting member 66. Installed on a top surface of the antenna member 74 is a higher dielectric disc-shaped wave-delay member 76 having a higher dielectric constant than that of a vacuum. A lid-shaped shield lid 78 is provided to cover both the antenna member 74 and the wave-delay member 76, and a bottom portion of the shield lid 78 is supported by a top portion of the supporting member 66. The shield lid 78 has therein a cooling path 79 for allowing a cooling water to flow therethrough, to thereby cool the shield lid 78, the wave-delay member 76 and the like. Further, the shield lid 78 is grounded. Moreover, the planar antenna member 74 is installed to face the workpiece mount base 44 in the processing vessel 42.

In case of a wafer having a diameter of, e.g., 8 inch, the planar antenna member 74 is made of a circular conducting plate, e.g., an aluminum plate or a copper plate with a surface thereof silver-plated, wherein the plate has a diameter ranging from 300 to 400 mm and a thickness ranging from 1 to several mm, e.g., 5 mm. Further, the circular plate has a plurality of microwave radiation holes 80 arranged in a concentric or a spiral shape, wherein each of the microwave radiation holes is made of, e.g., a long slit-shaped groove or a circular-shaped hole.

An opening 86 is formed at a central top portion of the shield lid 78. A waveguide 82 is connected to the opening 86 and a microwave generating source for generating a microwave of, e.g., 2.45 GHz, is connected to an end portion of the waveguide 82. Accordingly, the microwave generated from a microwave generating source 84 can be propagated to the planar antenna member 74 via the waveguide 82. Further, the frequency of the microwave can be 8.35 GHz, 1.98 GHz, and the like.

To be specific, the waveguide 82 includes a coaxial waveguide 82A with a circular cross section and a rectangular waveguide 82B with a rectangular cross section, wherein the coaxial waveguide 82A is directly connected and upwardly fixed to the central opening 86 of the shield lid 78 and the rectangular waveguide 82B is horizontally connected and fixed to a top portion of the coaxial waveguide 82A via a mode converter 88 for converting a vibration mode of the microwave.

Furthermore, connected to the antenna member 74 is a member elevating mechanism 85 for relatively varying a vertical distance between the antenna member 74 and the shield lid 78. Specifically, the coaxial waveguide 82A has therein a stick-shaped internal conductor 90 extending through a center of the coaxial waveguide 82A, and a bottom end of the internal conductor 90 is connected and fixed to a central portion of the planar antenna member 74 to thereby hold the planar antenna member 74. The internal conductor 90 is a part of the member elevating mechanism 85 as a driving shaft. Further, a screw 92 formed at an upper portion of the internal conductor 90 is screw-coupled to a ridge 94, serving as a screw holder, provided on a ceiling wall of the mode converter 88. A top end of the screw 92 penetrates through a ceiling wall of the mode converter 88 so that the top end of the screw 92 may be connected to a shaft of a screw driving motor 96 fixed to the mode converter 88 by a holder 98. Therefore, the screw 92 is rotated by the screw driving motor 96 such that the planar antenna member 74 and the wave-delay member 76 provided thereon can be elevated (moved up and down) as a unit (shown in FIG. 2).

Meanwhile, a pin hole 100 is formed on a sidewall of the rectangular waveguide 82B. Installed through the pin hole 100 is a tuning rod 104 connected to an actuator 102 serving as a tuning rod driving device, the tuning rod 104 being insertable (protrusile) into the rectangular waveguide 82B. Further, the actuator 102 is fixed to the rectangular waveguide 82B by a holder 106. The tuning rod 104 is made of, e.g., a metal conductor, lead zirconate titanate (PZT), alumina, ceramic and the like. An insert portion of the tuning rod 104 functions as an impedance while a front end space portion functions as a reactance, so that the impedance can be controlled by varying an insert amount of the tuning rod 104 into the rectangular waveguide 82B. The tuning rod 104 may be grounded, if necessary.

Further, installed on the rectangular waveguide 82B located further upstream from an install position of the tuning rod 104 is a reflection wave detecting section 108 for detecting a state of a reflection wave of the microwave. The reflection wave detecting section 108 has a pair of detecting probes 110 provided inside rectangular waveguide 82A, the detecting probes 110 being apart from each other by a distance L1 corresponding to a quarter of a wavelength $\lambda$ along a propagation direction of the microwave. When a signal detected from the detecting probes 110 are inputted into a detecting body 112, a power and a phase of the reflection wave can be measured.

An output of the detecting body 112 is outputted to a matching control section 114 including, e.g., a microcomputer. The matching control section 114 outputs a driving signal to be used for a matching adjustment to each of the screw driving motor 96 and the actuator 102.

Hereinafter, a processing method performed by using the plasma processing apparatus described above will be described.

First of all, a semiconductor wafer W is introduced into the processing vessel 42 by a transfer arm (not shown) via the gate valve 60 and then mounted onto a mounting surface of the workpiece mount base 44 by moving vertically a lifter pin (not shown).

Further, an inner space of the processing vessel 42 is maintained at a certain processing pressure and provided with, e.g., Ar gas or a deposition gas such as $SiH_4$ gas, $O_2$ gas, $N_2$ gas and the like supplied through the gas supply nozzle 58 with flow rates thereof controlled, respectively. At the same time, a microwave is supplied from the microwave generating source 84 to the planar antenna member 74 sequentially via the rectangular waveguide 82B, the mode converter 88 and the coaxial waveguide 82A so that a microwave with a wavelength thereof shortened by the wave-delay member 76 may be introduced into a processing space S, thereby generating a plasma to perform a certain plasma process, e.g., a film forming process by a plasma CVD.

Herein, the microwave generated from the microwave generating source 84 is propagated as a TE mode within the rectangular waveguide 82B. The TE mode of the microwave is converted into a TEM mode by the mode converter 88 so that the microwave may be propagated as the TEM mode through the coaxial waveguide 82A toward the antenna member 74.

A reflection wave of the microwave may be generated inside the waveguide 82 due to various factors such as a plasma state or a pressure state in the processing space S. A power or a phase of the reflection wave is detected by the reflection wave detecting section 108. In order to minimize the reflection wave, the matching control section 114 moves the tuning rod 104 vertically to vary an insert amount thereof or elevates the planar antenna member 74 to vary a distance L2 between the planar antenna member 74 and the shield lid 78. That is, the matching control section 114 performs a matching function.

As illustrated in FIG. 2, the insert amount of the tuning rod 104 into the rectangular waveguide 82B is controlled so that an impedance including an L component thereof and a C component thereof may be modified. Further, the distance L2 between the planar antenna member 74 and the shield lid 78 provided thereabove is controlled so that the impedance may be modified and, therefore, the impedance in the waveguide 82 may be modified to minimize the reflection wave. The impedance adjustment for minimizing the reflection wave is continuously performed by the matching control section 114 during the plasma process.

Figure 3:
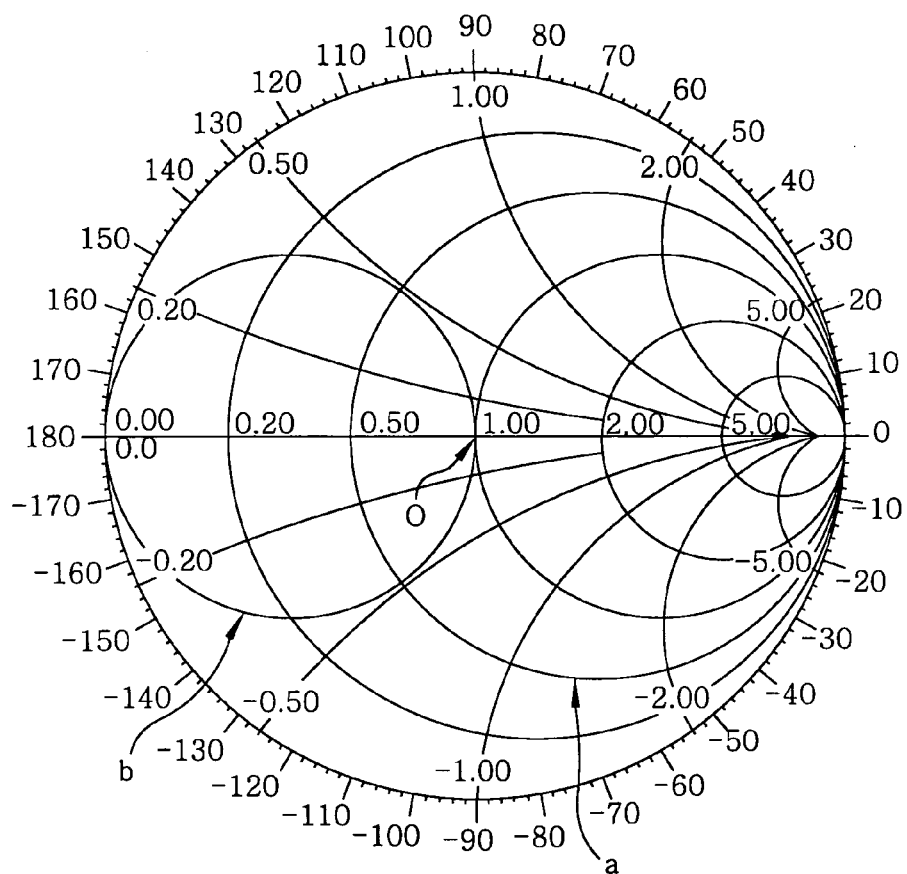
FIG. 3 describes a Smith chart for showing a relationship between a reflection coefficient and an impedance when a planar antenna member is elevated.

A condition for the impedance adjustment will be described with reference to a Smith chart illustrated in FIG. 3. Above all, by adjusting the tuning rod 104 of the rectangular waveguide 82B, a combined impedance seen from the detecting body 112 moves along a track of a curved line b on the Smith chart and then finally reaches a center O, thereby performing a matching. Therefore, by elevating the planar antenna member 74, it is desirable to determine the distance L2 which will most likely make the combined impedance follow a track like a curved line a. Preferably, as illustrated by the curved line a, the combined impedance seen from the detecting body 112 moves along a circle, which shows a real part of a normalized impedance is a constant.

In this case, a maximum stroke of the distance L2 on the planar antenna member 74 depends on the wavelength of the microwave and is chosen to be about a half of a shortened wavelength $\lambda 1$ due to the wave-delay member 76, e.g., 60 mm.

Figure 9:
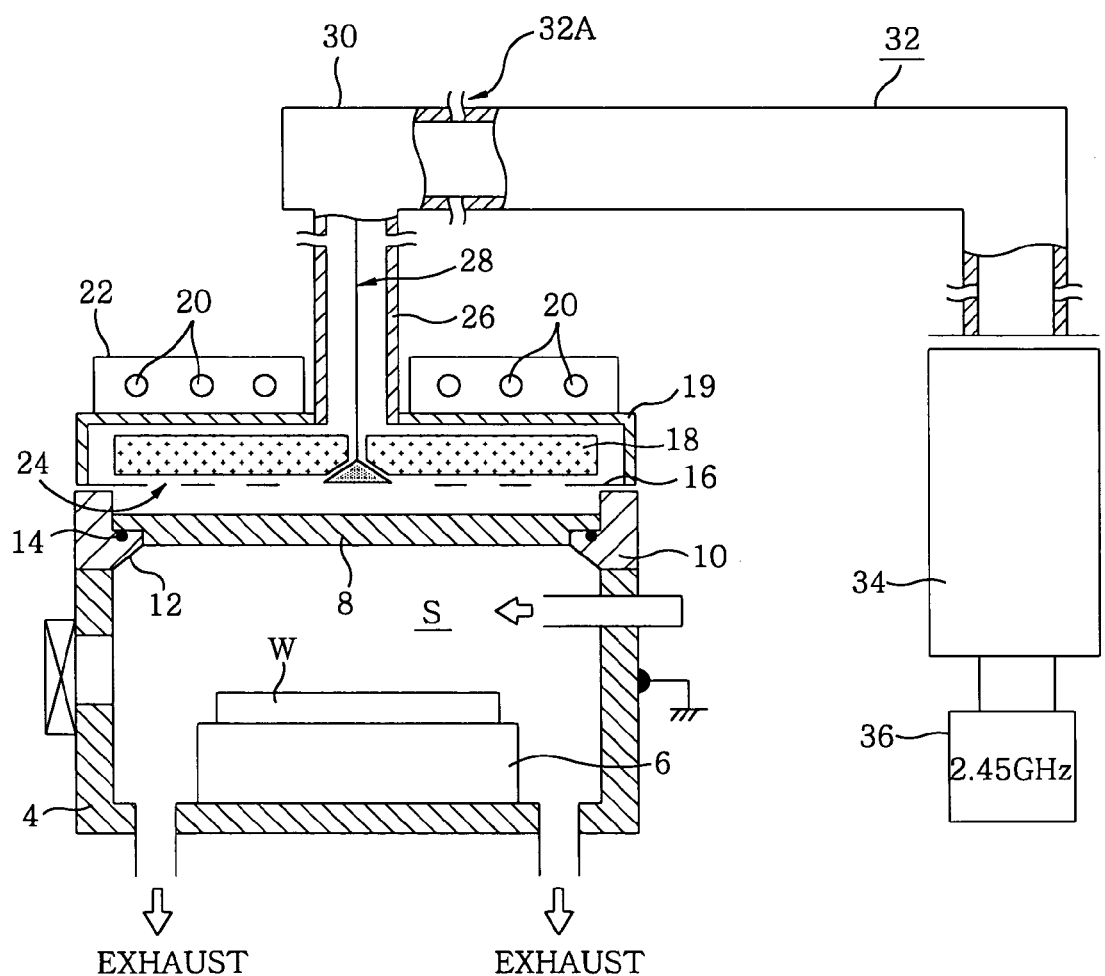
FIG. 9 sets forth a configuration view for showing a conventional plasma processing apparatus.

As described above, since the elevating planar antenna member 74 and the vertically moving tuning rod 104 are used to perform the matching adjustment, the large-sized matching circuit 34 (shown in FIG. 9) required in the conventional apparatus becomes unnecessary. Further, since a length of the waveguide itself can be shortened, a size and a weight of a propagation system for the microwave can be greatly reduced.

Furthermore, due to the scaling-down and the light-weighting of the propagation system for the microwave, the waveguide 82 (including 82A and 82B), the mode converter 88 and the microwave generating source 84 can be assembled to be mounted via the shield lid 78 as a unit. As a result, the maintenance and repair works of the processing apparatus can be carried out simply by separating the shield lid 78 from the processing vessel 42, thereby facilitating a rapid maintenance and repair work.

Moreover, since the overall length of the waveguide in which a multiple reflection wave may be generated can be totally shortened, a loss of the microwave can be reduced.

Figure 4:
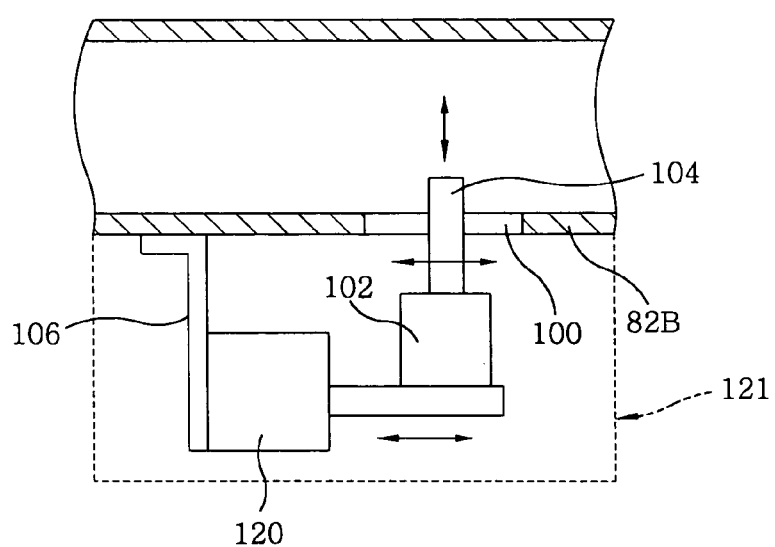
FIG. 4 depicts a partially enlarged view of a modified example of a tuning rod.

In addition, although only the insert amount of the tuning rod 104 into the rectangular waveguide 82B can be adjusted in this embodiment, the present invention is not limited thereto. Specifically, the tuning rod 104 may move along a longitudinal direction of the rectangular waveguide 82B. FIG. 4 provides a partially enlarged view for a modified example of the tuning rod. The pin hole 100 is chosen to be a long hole having a predetermined length along the longitudinal direction of the rectangular waveguide 82B. Further, a second actuator 120 may allow the actuator 102 to move along a longitudinal direction of the rectangular waveguide 82B, wherein the actuator 102 directly moves up and down the tuning rod 104. Further, the second actuator 120 may be supportively fixed to the rectangular waveguide 82B by the holder 106. Furthermore, all the elements described above may be covered by a shield 121 to prevent the microwave from leaking.

Accordingly, a longitudinal location of the rectangular waveguide 82B as well as the insert amount of the tuning rod 104 into the rectangular waveguide 82B can be adjusted, thereby making a matching adjustment be performed properly.

Figure 5:
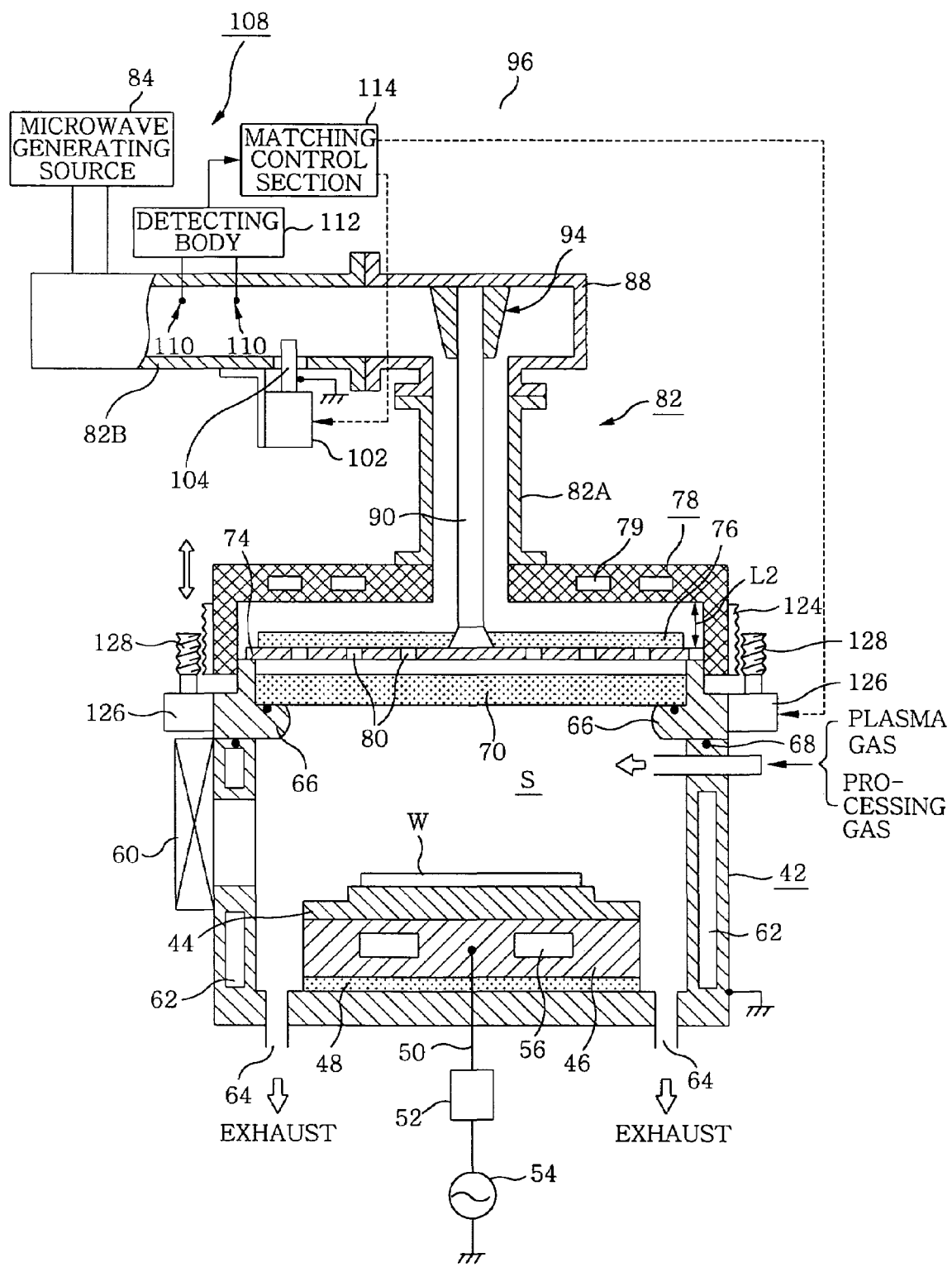
FIG. 5 provides a configuration view for showing a plasma processing apparatus in accordance with a second preferred embodiment of the present invention.

Although the distance L2 between the planar antenna member 74 and the shield lid 78 is adjusted by elevating the planar antenna member 74 in this embodiment, the shield lid 78 can be elevated instead of the planar antenna member 74. FIG. 5 presents a plasma processing apparatus in accordance with a second preferred embodiment of the present invention. Like reference numerals have been assigned to parts identical or similar to those described in FIG. 1 to thereby omit detailed explanation thereof.

As illustrated in FIG. 5, in the second preferred embodiment, a planar antenna member 74 is fixed to a supporting frame member 66 provided above a processing vessel 42, and a top end of an internal conductor 90 installed in a coaxial waveguide 82A is fixed to a mode converter 88 by a ridge 94. In addition, a screw driving motor 96 (shown in FIG. 1) is not installed in the second embodiment. Further, a bottom end of the internal conductor 90 is connected to a center of the planar antenna member 74.

Further, a bottom end of a shield lid 78 is not fixed on a top end of the supporting member 66 but slidably inserted into the top end of the supporting member 66 to thereby make it moveable in a vertical direction. Furthermore, a plurality of, e.g., three, racks 124 (only two racks are shown in FIG. 5) are installed on a side surface of the shield lid 78 along a circumferential direction thereof, the racks 124 being spaced from each other by an approximately identical interval. Each of the racks 124 engages with one of rotary screws 128 rotated clockwise and counterclockwise by a driving motor 126 fixed to the supporting member 66 or the processing vessel 42. By rotating the rotary screws 128 clockwise and counterclockwise, the shield lid 78 and a structure thereon can be elevated as a unit. Accordingly, the distance L2 between the shield lid 78 and the planar antenna member 74 can be arbitrarily controlled.

The second embodiment can also provide the same functions and effects as the processing apparatus described with reference to FIG. 1. Further, since the antenna member 74 is fixed in the second embodiment, the distance between the antenna member 74 and the processing space S is not changed so that it is advantageous in that a location at which a plasma is generated in the processing vessel 42 is not changed.

In the aforementioned embodiments, even if a tuning rod 104 has been installed and the planar antenna member 74 has been relatively elevated with respect to the shield lid 78 to perform a matching function, a small-sized matching circuit using a printed circuit board can be employed instead of the aforementioned embodiments.

Figure 6:
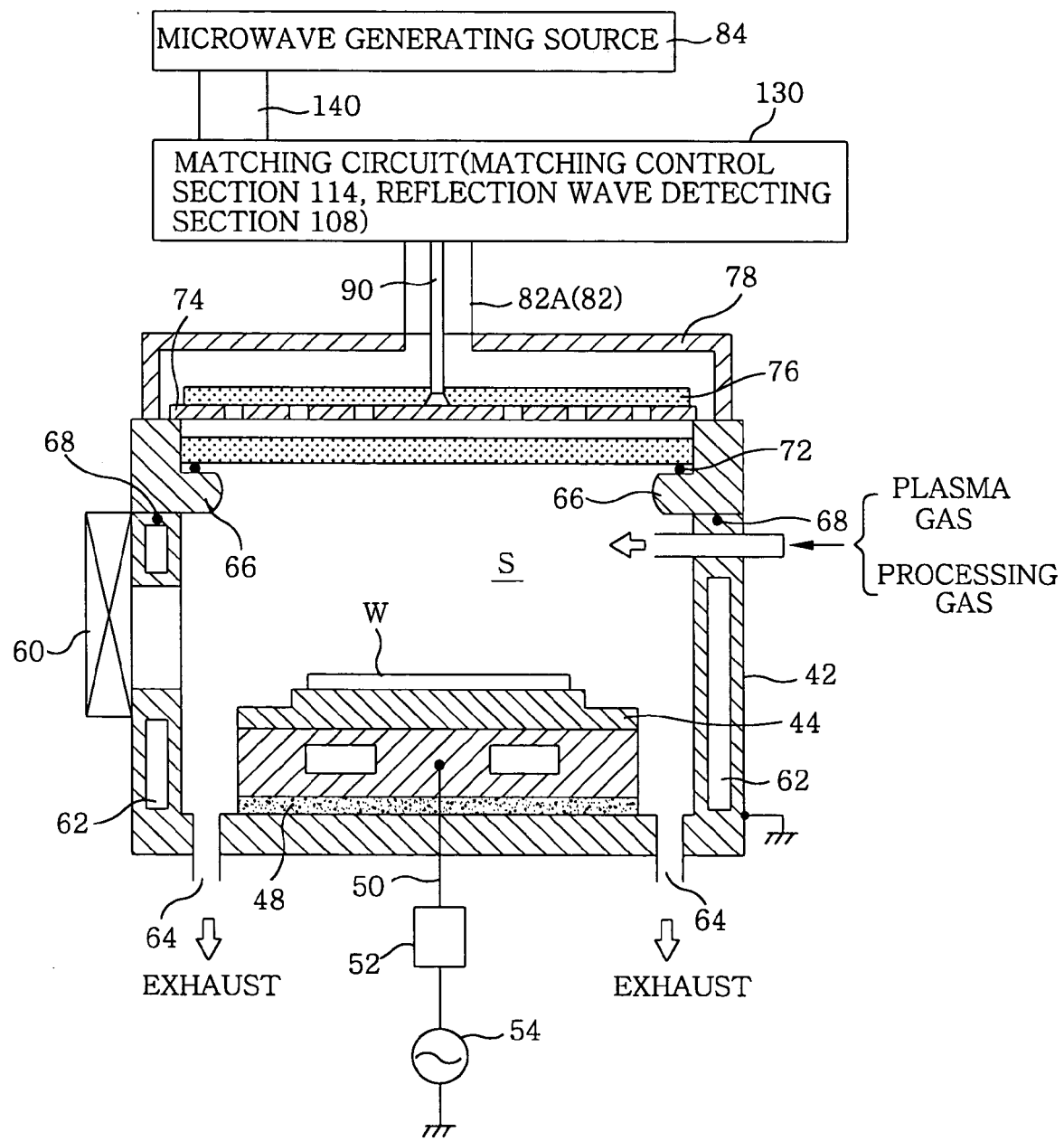
FIG. 6 presents a configuration view for illustrating a plasma processing apparatus in accordance with a third preferred embodiment of the present invention.
Figure 7:
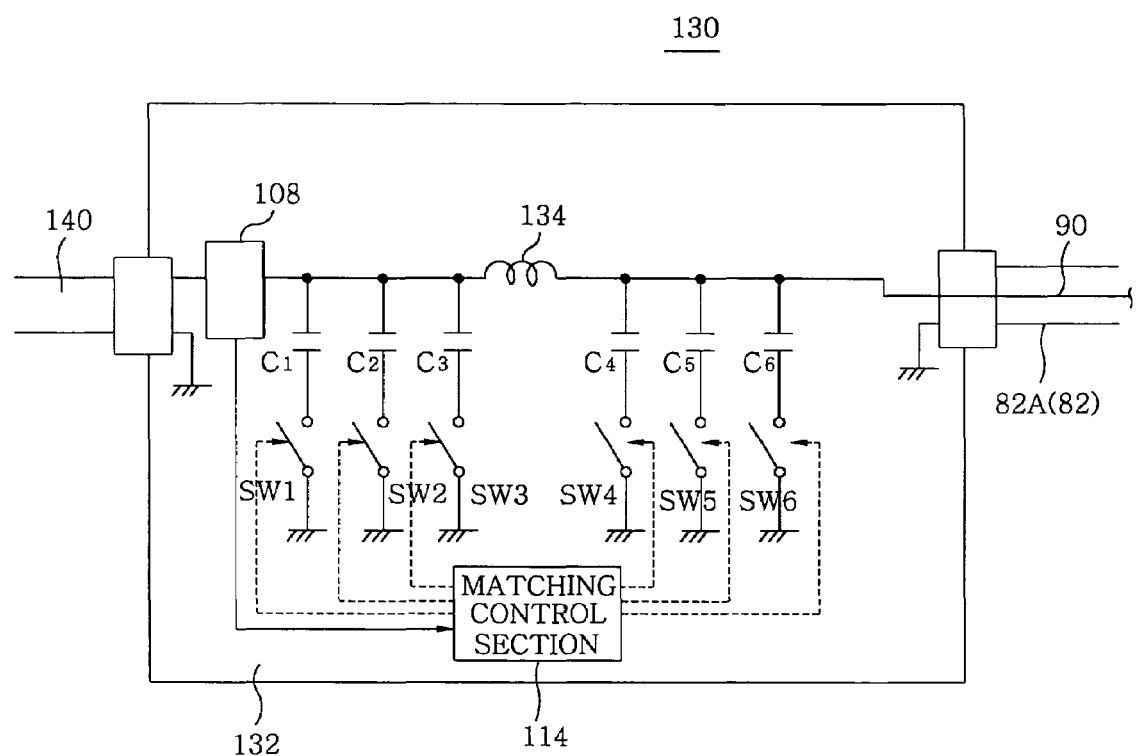
FIG. 7 represents a configuration view of a matching circuit using a printed circuit board.

FIG. 6 illustrates a third preferred embodiment of the plasma processing apparatus in accordance with the present invention. FIG. 7 shows a matching circuit using the printed circuit board. Further, like reference numerals have been assigned to parts identical or similar to those described in FIG. 1 and detailed explanation thereof is omitted.

Only a coaxial waveguide 82A is used as a waveguide 82, as illustrated in FIG. 6. The coaxial waveguide 82A is vertically installed at a central portion of a shield lid 78 and a small-sized matching circuit 130, which is a main characteristic feature of the third embodiment, is installed on an upper end of the coaxial waveguide 82. Further, the matching circuit 130 is connected to a microwave generating source 84 by a coaxial cable 140.

Specifically, the matching circuit 130 has a base formed by a printed circuit board 132, as illustrated in FIG. 7. A plurality of, e.g., six in FIG. 7, series connections are connected in parallel on the printed circuit board 132, each series connection having a phase advance element, i.e., a capacitor, and a switching device. A phase delay element, i.e., a coil 134, is installed in a middle of the parallel connection described above. The six series connections includes six capacitors C1 to C6 and six switching devices SW1 to SW6 connected in series, respectively, and the coil 134 is installed between the capacitor C3 and the capacitor C4. Further, one end of a capacitor C1 is connected to the coaxial cable 140 located above while the other end of a capacitor C6 is connected to an internal conductor 90 located below.

Capacitances of the capacitors C1 to C6 are different from each other, and different weights are applied thereto. If the symbols C1 to C6 are indicated as capacitances thereof, the weights of the capacitances are applied in accordance with an exponential in binary as follows:

$C2 = 2^1 \times C1$ $C3 = 2^2 \times C1$ $C4 = 2^3 \times C1$ $C5 = 2^4 \times C1$ $C6 = 2^5 \times C1$ Further, by appropriately combining and switching the switching devices SW1 to SW6, a combined capacitance within a wide range can be applied thereto. Each of the capacitors C1 to C6 can be easily formed by performing a pattern etching on the printed circuit board 132.

Further, the switching devices SW1 to SW6 can be easily formed by arranging PIN diodes on the printed circuit board 132, for example. Furthermore, instead of the PIN diodes, mechanical micro relays can be used. Each of the switching devices SW1 to SW6 is appropriately switched by an instruction from a matching control section 114.

The number of series connections, each having a capacitor and a switching device, is not limited to six. The more series connections there are, the higher may be a resolution of a reactance. Further, an IC chip having an integrated circuit which functions as a reflection wave detecting section 108 or the matching control section 114 can be mounted on the printed circuit board 132, or a circuit which functions as described above can be built onto the printed circuit board 132.

In accordance with the third preferred embodiment, an opening and closing of each of the switching devices SW1 to SW6 is appropriately selected by the instruction of the matching control section 114, so that an impedance of the matching circuit 130 can be appropriately modified and, thus, a reflection wave of the microwave can be minimized.

Figure 8A:
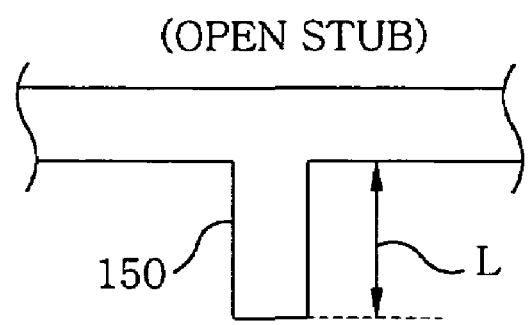
FIG. 8 illustrates a phase advance element and a phase delay element formed by using microstrip lines.
Figure 8B:
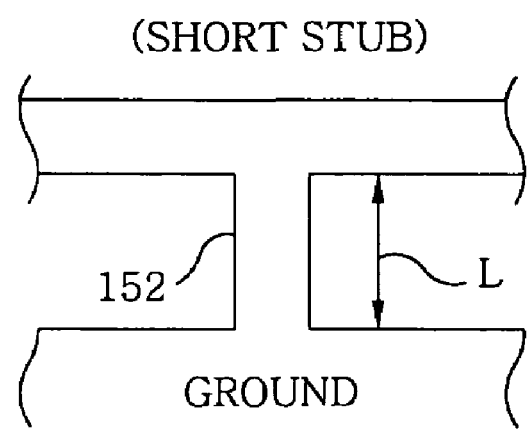

The structure described above can be implemented on a printed circuit board (PCB). In the third embodiment, the capacitor, i.e., the phase advance element, and the coil, i.e., the phase delay element, may be formed with an open stub and/or a short stub using microstrip lines, as illustrated in FIGS. 8A and 8B. In FIG. 8A, if a length L of a stub 150 is smaller than a quarter of the wavelength, the stub 150 serves as the capacitor (phase advance element) and, if the length L is greater than a quarter of the wavelength and smaller than a half of the wavelength, the stub 150 serves as the inductor (phase delay element).

Contrary to FIG. 8A, in FIG. 8B, if a length L of a stub 152 is smaller than a quarter of the wavelength, the stub 152 serves as the inductor (phase delay element) and, if the length L is greater than a quarter of the wavelength and smaller than a half of the wavelength, the stub 152 serves as the capacitor (phase advance element).

By variously varying the length L of the stub, various phase advance element and phase delay element can be manufactured on the PCB.

Therefore, a large-sized matching circuit in the conventional processing apparatus is not needed and, further, a size and a weight of the processing apparatus can be reduced, thereby obtaining the same functions and effects as described in the aforementioned embodiments.

Although the film forming process on the semiconductor wafer was exemplarily described in the present embodiment, the present invention is not limited thereto but can be applied to other plasma processes such as a plasma etching process, a plasma ashing process and the like.

As described above, the plasma processing apparatus in accordance with the present invention has the functions and effects as will be described below.

In accordance with the plasma processing apparatus of the present invention, both the planar antenna member which is relatively moved up and down and the tuning rod whose insert amount into the waveguide may be controllable are used to perform a matching function for preventing the reflection wave of the microwave from being generated. Thus, the structure of the propagation system of the microwave can be greatly reduced and, accordingly, the propagation system of the microwave, which includes the microwave generating source, can be mounted on the shield lid as a unit. As a result, the maintenance and the repair of the plasma processing apparatus can be carried out simply by separating the shield lid from the processing vessel without separating the waveguide and the like, so that the maintenance and the repair can be performed quickly and easily.

Further, since the length of the waveguide for propagating the microwave therethrough can be shortened, it is possible to suppress the generation of the reflection wave and/or the power loss.

Furthermore, in accordance with the plasma processing apparatus of the present invention, the printed circuit board may be used to scale down the matching circuit. Thus, the structure of the propagation system of the microwave can be greatly reduced and, accordingly, the propagation system of the microwave, which includes the microwave generating source, can be mounted on the shield lid as a unit.

As a result, the maintenance and the repair of the plasma processing apparatus can be carried out simply by separating the shield lid from the processing vessel without separating the waveguide and the like, so that the maintenance and the repair work can be performed quickly and easily.

Further, since the length of the waveguide for propagation therethrough the microwave can be shortened, it is possible to suppress the generation of the reflection wave or the power loss.

While the invention has been shown and described with respect to the preferred embodiments, it will be understood by those skilled in the art that various changes and modifications may be made without departing from the spirit and scope of the invention as defined in the following claims.

What is claimed is:

1. A plasma processing apparatus comprising:
   an evacuatable processing vessel;
   a workpiece mount base, installed in the processing vessel, for mounting thereon an object to be processed;
   a microwave transmitting plate provided in an opening of a ceiling of the processing vessel;
   a planar antenna member with a plurality of microwave radiation holes and disposed above the microwave transmitting plate, for supplying a microwave into the processing vessel via the microwave transmitting plate;
   a grounded shield lid portion provided directly above the planar antenna member to cover a top of the planar antenna member;
   a waveguide for guiding the microwave from a microwave generating source to the planar antenna member;
   a member elevating mechanism for relatively varying a vertical distance between the planar antenna member and the shield lid portion by moving the shield lid portion;
   a tuning rod insertable into the waveguide;
      a tuning rod driving mechanism for moving the tuning rod to adjust an insert amount thereof; and
      a matching control section for controlling an elevation amount of the shield lid portion and the insert amount of the tuning rod to obtain a matching adjustment.

2. The plasma processing apparatus of claim 1, wherein a reflection wave detecting section for detecting a state of a reflection wave of the microwave is installed in the waveguide at an upstream of the tuning rod.

3. The plasma processing apparatus of claim 1, wherein the detected state of the reflection wave is represented in terms of a power and a phase.

4. The plasma processing apparatus of claim 1, wherein the waveguide has therein a mode converter for converting a vibration mode of the microwave.

5. A plasma processing apparatus comprising:
   an evacuatable processing vessel;
   a workpiece mount base, installed in the processing vessel, for mounting thereon an object to be processed;
   a microwave transmitting plate provided in an opening of a ceiling of the processing vessel;
   a planar antenna member with a plurality of microwave radiation holes and disposed above the microwave transmitting plate for supplying a microwave into the processing vessel via the microwave transmitting plate;
   a grounded shield lid provided directly above the planar antenna member to cover a top of the planar antenna member;
   a waveguide for guiding the microwave from a microwave generating source to the planar antenna member;
   a member elevating mechanism for relatively varying a vertical distance between the planar antenna member and the shield lid portion by moving either the planar antenna member or the shield lid portion;
   a tuning rod insertable into the waveguide;
      a tuning rod driving mechanism for moving the tuning rod to adjust an insert amount thereof; and
      a matching control section for controlling the vertical distance and the insert amount of the tuning rod to obtain a matching adjustment.

6. The plasma processing apparatus of claim 5, wherein the member elevating mechanism moves the planar antenna member vertically with respect to the shield lid portion.

7. The plasma processing apparatus of claim 5, wherein the member elevating mechanism moves the shield lid portion vertically with respect to the planar antenna member.

8. A plasma processing apparatus comprising:
   an evacuatable processing vessel;
   a workpiece mount base, installed in the processing vessel, for mounting thereon an object to be processed;
   a microwave transmitting plate provided in an opening of a ceiling of the processing vessel;
   a planar antenna member with a plurality of microwave radiation holes and disposed above the microwave transmitting plate, for supplying a microwave into the processing vessel via the microwave transmitting plate;
   a grounded shield lid portion provided directly above the planar antenna member to cover a top of the planar antenna member;
   a waveguide for guiding the microwave from a microwave generating source to the planar antenna member;
   a member elevating mechanism for relatively varying a vertical distance between the planar antenna member and the shield lid portion, by moving the planar antenna member;
   a tuning rod insertable into the waveguide;
      a tuning rod driving mechanism for moving the tuning rod to adjust an insert amount thereof; and a matching control section for controlling an elevation amount of the planar antenna member and the insert amount of the tuning rod to obtain a matching adjustment.

9. The plasma processing apparatus of claim 8, wherein a reflection wave detecting section for detecting a state of a reflection wave of the microwave is installed in the waveguide at an upstream of the tuning rod.

10. The plasma processing apparatus of claim 8, wherein the detected state of the reflection wave is represented in terms of a power and a phase.

11. The plasma processing apparatus of claim 8, wherein the waveguide has therein a mode converter for converting a vibration mode of the microwave.

12. The plasma processing apparatus of claim 8, wherein the waveguide has therein a driving shaft for elevating the planar antenna member.

* * * * *